US012575165B2

(12) United States Patent
Sen Gupta et al.

(10) Patent No.: US 12,575,165 B2
(45) Date of Patent: Mar. 10, 2026

(54) TRANSISTOR DEVICES WITH HIGH-K PEROVSKITE GATE DIELECTRICS

(71) Applicant: Intel Corporation, Santa Clara, CA (US)

(72) Inventors: Arnab Sen Gupta, Beaverton, OR (US); Abhishek A. Sharma, Hillsboro, OR (US); Matthew V. Metz, Portland, OR (US); Kaan Oguz, Portland, OR (US); Urusa Shahriar Alaan, Hillsboro, OR (US); Scott B. Clendenning, Portland, OR (US); Van H. Le, Beaverton, OR (US); Chia-Ching Lin, Portland, OR (US); Jason C. Retasket, Beaverton, OR (US); Edward O. Johnson, Jr., Saint Helens, OR (US)

(73) Assignee: Intel Corporation, Santa Clara, CA (US)

( * ) Notice: Subject to any disclaimer, the term of this patent is extended or adjusted under 35 U.S.C. 154(b) by 885 days.

(21) Appl. No.: 17/666,627

(22) Filed: Feb. 8, 2022

(65) Prior Publication Data

US 2023/0253476 A1      Aug. 10, 2023

(51) Int. Cl.
| | |
|---|---|
| *H01L 29/51* | (2006.01) |
| *H10B 12/00* | (2023.01) |
| *H10D 30/62* | (2025.01) |
| *H10D 30/67* | (2025.01) |
| *H10D 62/10* | (2025.01) |
| *H10D 64/66* | (2025.01) |
| *H10D 64/68* | (2025.01) |
| *H10D 64/23* | (2025.01) |

(52) U.S. Cl.
CPC .......... *H10D 64/691* (2025.01); *H10B 12/36* (2023.02); *H10D 30/62* (2025.01); *H10D 30/6735* (2025.01); *H10D 62/121* (2025.01); *H10D 64/667* (2025.01); *H10D 30/6219* (2025.01); *H10D 30/6729* (2025.01); *H10D 30/6739* (2025.01); *H10D 30/6757* (2025.01); *H10D 64/258* (2025.01)

(58) Field of Classification Search
CPC .. H10D 64/691; H10D 30/62; H10D 30/6735; H10D 62/121; H10D 64/667; H10D 30/6219; H10D 30/6729; H10D 30/6739; H10D 30/6757; H10D 64/258; H10D 30/43; H10D 62/151; H10D 1/682; H10B 12/36; H10B 12/03; B82Y 10/00
See application file for complete search history.

(56) References Cited

U.S. PATENT DOCUMENTS

| | | | |
|---|---|---|---|
| 2015/0243796 A1* | 8/2015 | Bedell | H10D 30/6758 |
| | | | 438/151 |
| 2017/0133383 A1* | 5/2017 | Pandey | H10B 12/31 |
| 2022/0309372 A1* | 9/2022 | Li | H10D 48/3835 |

* cited by examiner

*Primary Examiner* — Cuong B Nguyen
(74) *Attorney, Agent, or Firm* — Akona IP PC

(57) ABSTRACT

Described herein are transistor devices formed using perovskite gate dielectrics. In one example, a transistor includes a high-k perovskite dielectric material between a gate electrode and a thin film semiconductor channel. In another example, four-terminal transistor includes a semiconductor channel, a gate stack that includes a perovskite dielectric layer on one side of the channel, and a body electrode on an opposite side of the channel. The body electrode adjusts a threshold voltage of the transistor.

20 Claims, 10 Drawing Sheets

900

Sense baseline threshold voltage — 902

Determine bias voltage to set threshold voltage — 904

Apply bias voltage to body terminal — 906

Apply gate voltage to turn transistor on/off — 908

1500

SEE FIG. 10B

1502

1502

TRANSISTOR DEVICES WITH HIGH-K PEROVSKITE GATE DIELECTRICS

TECHNICAL FIELD

This disclosure relates generally to the field of integrated circuit (IC) structures and devices, and more specifically, to transistor devices that include a perovskite gate dielectric, such as strontium titanate.

BACKGROUND

Generally, perovskite materials have a wide variety of applications in the modern electronic industry. Different perovskite materials have different material properties, e.g., with different structures and different levels of conductance. Some perovskite materials are conductors, some are semiconductors, and some are insulators. Some examples of applications of perovskite materials include usage in capacitors and transistors. Transistors in integrated circuits can be utilized for creating memory devices, e.g., a transistor may be used as an access transistor in a dynamic random-access memory (DRAM) device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 10A and 1013 are top views of a wafer and dies that include a transistor having a perovskite gate dielectric in accordance with any of the embodiments disclosed herein.

DETAILED DESCRIPTION

Overview

Figure 1:
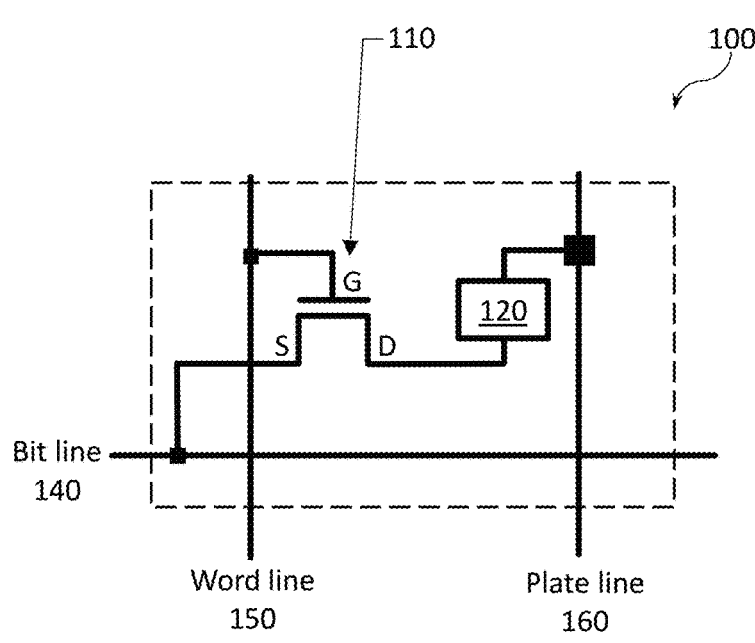
FIG. 1 is an electrical circuit diagram of an example one access transistor (1T) and one memory element (1X) (1T-1X) memory cell, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Described herein are IC devices that include transistors with a high-k perovskite gate dielectric. One example IC device includes memory cells for storing bits of data. A memory cell may include a capacitor for storing a bit value or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source or drain (S/D) region/terminal of the access transistor (e.g., to the source region of the access transistor) by a first S/D contact, while the other S/D region of the access transistor may be coupled to a bitline (BL) by a second S/D contact, and a gate terminal of the transistor may be coupled to a word-line (WL) by a gate contact. Various 1T-1C memory cells have, conventionally, been implemented with access transistors being front end of line (FEOL), logic-process based, transistors implemented in an upper-most layer of a semiconductor substrate.

The BL and WL are each formed from metal interconnects that are coupled to additional memory cells, and in particular, access transistors of other memory cells. For example, a BL runs along a column of memory cells, and the BL is coupled to one S/D terminal of each of the access transistors in the column of memory cells via an S/D contact. A WL runs along a row of memory cells, and the WL is coupled to the gate of each of the access transistors in the row of memory cells via a gate contact.

Transistors, such as the access transistor of the memory cell described above, typically include a gate stack coupled to a semiconductor channel. A gate stack includes a gate electrode and a gate dielectric, with the gate dielectric formed between the gate electrode and the channel material. The gate electrode is controlled by the WL to turn the transistor on or off. In some implementations, a high-k gate dielectric is used, where a "high-k dielectric" refers to a material having a higher dielectric constant (k) than silicon oxide. One typical dielectric material used in gate stacks is hafnium oxide ($HfO_2$). Using dielectrics with higher dielectric constants can improve performance of the gate dielectric and, more generally, improve performance of the transistor.

As described herein, high-k perovskite materials can be used to form gate dielectrics in transistors. Perovskites generally have a chemical formula $ABX_3$, where A and B are ions, and X is an ion that bonds to both A and B. X is often oxygen (O), forming a perovskite oxide, so the chemical formula may be written $ABO_3$, where A and B are ions that bond to oxygen. An idealized form of the perovskite structure is cubic, and perovskite materials often have a cubic or near-cubic crystal structure. Materials such as $SrTiO_3$, $BaSrTiO_3$, and $LaAlO_3$ are some examples of perovskites that have dielectric constants that are substantially greater than oxides of other metals such as hafnium or zirconium. These materials perform well as gate dielectrics. To fully utilize a high-k dielectric constant property of such perovskite materials, it is important for the perovskite material to be crystalline and stable at high temperatures.

Transistors, such as the access transistor of the memory cell described above, also include a channel material in which two S/D regions are formed. The channel material is typically a semiconductor, such as silicon. Various different semiconductor materials have been used as transistor channel materials, such as germanium, indium antimonide, lead telluride, indium arsenide, indium phosphide, gallium arsenide, indium gallium arsenide, gallium antimonide, or other combinations of group III-V, group II-VI, or group IV materials. Additional transistor channel materials include various semiconducting oxides.

As described herein, one example transistor includes a channel, e.g., a thin-film channel, in combination with a high-k perovskite gate dielectric. The high-k perovskite gate dielectric may be grown over a suitable electrode material, such as ruthenium or titanium nitride. With repeated use, the electrical properties of the channel material can change. For example, the drive current in a channel can be reduced after repeated on-off cycling of the transistor. As mentioned above, transistors often have three independently-controlled terminals for the source, gate, and drain.

As disclosed herein, a fourth independently-controlled terminal, referred to as a body terminal, can be included in the transistor. The body terminal includes a dielectric layer coupled to the channel and an electrode coupled to the dielectric layer. The dielectric layer may include, for example, hafnium oxide, and the electrode may include, for example, ruthenium or titanium nitride. The body electrode may be on an opposite side of the channel from the gate electrode, e.g., in a bottom-gated transistor, the body electrode is formed on a top or front side of the channel. A voltage is applied to the body electrode to adjust the threshold voltage of the transistor. For example, a positive voltage on the body electrode reduces a positive voltage level for the gate electrode to turn on the transistor and increases a negative voltage level for the gate electrode to turn off the transistor. In some embodiments, a voltage applied by the body electrode counteracts changes to the electrical properties of the channel that occur with usage.

More generally, the transistors with high-k perovskite gate dielectrics described herein may be implemented in one or more components associated with an IC. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "logic state" of a ferroelectric memory cell refers to one of a finite number of states that the cell can have, e.g. logic states "1" and "0,"

each state represented by a different polarization of the ferroelectric material of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. In yet another example, a "high-k dielectric" refers to a material having a higher dielectric constant (k) than silicon oxide. The terms "oxide," "carbide," "nitride," etc. refer to compounds containing, respectively, oxygen, carbon, nitrogen, etc.

Example Transistor with High-k Perovskite Gate Dielectric

FIG. 1 is an electrical circuit diagram of an example one access transistor (1T) and one memory element (1X) (1T-1X) memory cell 100, according to some embodiments of the present disclosure. As shown, the 1T-1X cell 100 may include an access transistor 110 and a memory element 120. In some embodiments, the memory element 120 is a capacitor, and the memory cell 100 is a one-transistor one-capacitor (1T-1C) memory cell. In other embodiments, the memory element 120 may be, for example, a ferroelectric memory element, a magnetic storage element, a resistor, or another transistor, coupled to the access transistor 110.

The access transistor 110 has a gate terminal, a source terminal, and a drain terminal, indicated in the example of FIG. 1 as terminals G, S, and D, respectively. In the following, the terms "terminal" and "electrode" may be used interchangeably. Furthermore, for S/D terminals, the terms "terminal" and "region" may be used interchangeably.

As shown in FIG. 1, in the 1T-1X cell 100, the gate terminal of the access transistor 110 may be coupled to a word line (WL) 150, one of the S/D terminals of the access transistor 110 may be coupled to a bit line (BL) 140, and the other one of the S/D terminals of the access transistor 110 may be coupled to a first terminal of the memory element 120, e.g., a first electrode of a capacitor. As also shown in FIG. 1, the memory element 120 may have a second terminal. For example, if the memory element 120 is a capacitor, the capacitor is coupled to a plate line (PL) 160, as illustrated in FIG. 1. As is known in the art, WL, BL, and third terminal (e.g., the PL 160) may be used together to read and program the memory element 120.

Each of the BL 140, the WL 150, and the PL 160, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

Figure 2:
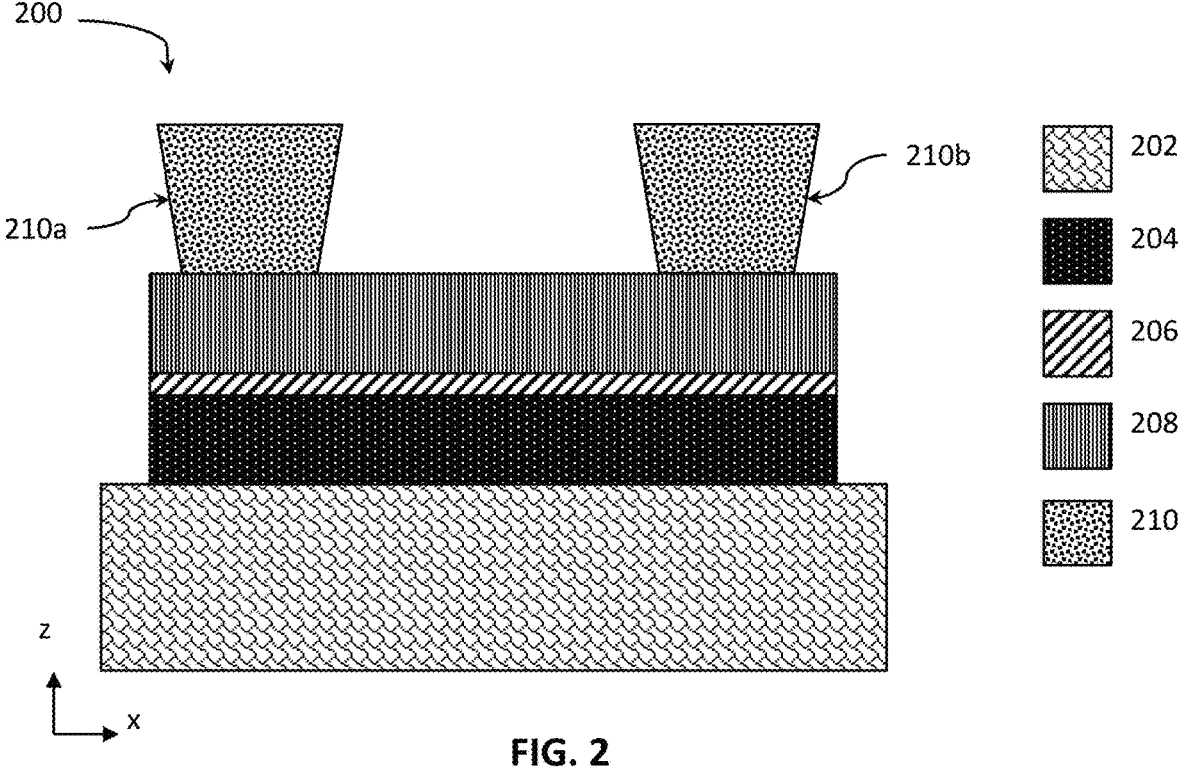
FIG. 2 is a cross-sectional view showing an example arrangement of a bottom-gated transistor having a perovskite gate dielectric, according to some embodiments of the present disclosure.

FIG. 2 is a cross-sectional view showing an example arrangement of a bottom-gated transistor 200 having a perovskite gate dielectric, according to some embodiments of the present disclosure. The transistor 200 is one example implementation of the access transistor 110 shown in FIG. 1.

In other embodiments, the transistor 200 may not be coupled to memory element 120 to form a 1T-1X memory cell, e.g., the transistor 200 may be used in a compute logic device.

A number of elements referred to in the description of FIGS. 2-5 and 8 with reference numerals are illustrated in these figures with different patterns, with a legend showing the correspondence between the reference numerals and patterns being provided at the bottom or side of each drawing page containing FIGS. 2-5 and 8. For example, the legend in FIG. 2 illustrates that FIG. 2 uses different patterns to show a support structure 202, a gate electrode 204, a gate dielectric 206, a channel material 208, and S/D contacts 210.

In the drawings, some example structures of various devices and assemblies described herein are shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

The transistor 200 is formed over a support structure 202. The transistor 200 includes two source/drain (S/D) contacts 210a and 210b, one of which (e.g., contact 210b) may be coupled to a memory element 120 for storing a bit of data. The transistor 200 further includes a gate electrode 204, a gate dielectric 206, and a channel material 208. The gate electrode 204 may be coupled to the WL 150, which may be coupled to a row of similar memory cells. As is known in the art, the channel 208 may include a first S/D region (not specifically shown in FIG. 2), which is coupled to the first S/D contact 210a, and a second S/D region (also not specifically shown in FIG. 2), which is coupled to the second S/D contact 210b. The first S/D contact 210a may be coupled to the BL 140, and the BL 140 may be coupled to a column of similar memory cells. The second S/D contact 210b may coupled to one terminal of the memory element 120, as shown in FIG. 1.

In general, implementations of the present disclosure may be formed or carried out on a support structure 202, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the support structure 202 may include any such substrate that provides a suitable surface for providing the transistor 200 shown in FIG. 2.

The transistor 200 is formed over the support structure 202. The gate electrode 204 and the gate dielectric 206 form a gate stack. The gate electrode 204 may include at least one P-type work function metal or N-type work function metal, depending on whether the transistor 200 is a PMOS transistor or an NMOS transistor (P-type work function metal used as the gate electrode 204 when the transistor 200 is a PMOS transistor and N-type work function metal used as the gate electrode 204 when the transistor 200 is an NMOS transistor). For a PMOS transistor, metals that may be used for the gate electrode 204 may include, but are not limited to, ruthenium, palladium, platinum, cobalt, nickel, and conductive metal oxides (e.g., ruthenium oxide). For an NMOS transistor, metals that may be used for the gate electrode 204 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). Other materials that may be used include titanium nitride, tantalum nitride, hafnium nitride, tungsten, iridium, copper, or degenerately doped poly-silicon. In some embodiments, the gate electrode 204 may consist of a stack of two or more metal layers, where one or more metal layers are work function metal layers and at least one metal layer is a fill metal layer. Further layers may be included next to the gate electrode 204 for other purposes, such as to act as a diffusion barrier layer or/and an adhesion layer.

As discussed below, the gate dielectric 206 may include a high-k perovskite material. If the perovskite material is grown over the gate electrode 204, the gate electrode 204 may be formed from a material or combination of materials that forms a suitable template for growing a high-k perovskite material with a desired crystal structure. For example, in some embodiments, the gate electrode 204 is formed from or includes ruthenium and/or iridium. In some embodiments, the gate electrode 204 is formed from or includes titanium nitride (TiN). Such materials may be lattice matched with a perovskite dielectric such that the perovskite dielectric can be grown with the desired crystal structure over the gate electrode 204.

The gate dielectric 206 is formed over the gate electrode 204. The gate dielectric 206 is formed from a high-k perovskite dielectric material. For example, the gate dielectric 206 may be strontium titanate ($SrTiO_3$). $SrTiO_3$ has a cubic structure with a lattice parameter of 3.905 Å. In other embodiments, different perovskite oxide dielectric materials may be used to form the gate dielectric 206. For example, in other embodiments, the gate dielectric 206 may include barium, e.g., $BaTiO_3$, or $Ba_xSr_{1-x}TiO_3$. In other embodiments, the gate dielectric may be lanthanum aluminate ($LaAlO_3$).

In some embodiments, the gate dielectric 206 is grown over the gate electrode 204 using epitaxial deposition, e.g., pulsed laser deposition or molecular-beam epitaxy. In other embodiments, the gate dielectric 206 is layer-transferred onto the gate electrode 204. For example, the gate dielectric 206 is grown on a separate substrate, the gate dielectric 206 is attached to a carrier wafer, the gate dielectric 206 is bonded to the gate electrode 204, and the carrier wafer is removed from the gate dielectric 206. The gate dielectric 206 may have a thickness, a dimension measured in the direction of the z-axis of the reference coordinate system x-y-z shown in FIG. 2, that may, in some embodiments, be between 0.5 nanometers and 20 nanometers, including all values and ranges therein (e.g., between 2 and 6 nanometers).

In some embodiments, a template layer, not specifically shown in FIG. 2, is formed between the gate electrode 204 and the gate dielectric 206. The template layer may be formed from a templating material, which is a material with a perovskite structure, e.g., a perovskite oxide having the generic chemical composition $ABO_3$. The template layer can serve as a suitable base for depositing an additional perovskite thin film over. The template layer may have a thickness between, e.g., 1.5 and 4 nanometers. At such thin thicknesses, the template layer may have a negligible effect on the electrical properties of the transistor 200. The template layer may be grown over the gate electrode 204 using epitaxial deposition, or the template layer may be layer-transferred onto the gate electrode 204, as described with respect to the gate dielectric 206.

The templating material may be a perovskite oxide that includes oxygen, strontium, and at least one additional metal. The additional metal may include a material included in the gate electrode 204, e.g., the templating material may include ruthenium if the gate electrode 204 includes ruthenium, or the templating material may include iridium if the gate electrode 204 includes iridium. The templating material may further include a second additional metal selected from, for example, titanium, scandium, rhodium, hafnium, barium, chromium, or iron. The templating material may have a chemical formula $Sr_xB_yO_{3-z}$, where B represents the additional metal (e.g., at least one of titanium, iridium, ruthenium, scandium, rhodium, hafnium, barium, chromium, or iron), x is between 0.1 and 1, y is between 0.1 and 1, and z is between 0 and 2.9. In embodiments that include two additional metals (e.g., ruthenium or iridium, and one of titanium, scandium, rhodium, hafnium, barium, chromium, and iron), the templating material may have a chemical formula $Sr_x(BB')_yO_{3-z}$, where B is the first additional metal, B' is the second additional metal, x is between 0.1 and 1, y is between 0.1 and 1, and z is between 0 and 2.9. As one example, B may be ruthenium, and B' may be titanium.

Forming the gate dielectric 206 over the template layer, rather than directly over the gate electrode 204, may improve the crystal structure of the gate dielectric 206, increasing the dielectric constant of the gate dielectric 206 and improving performance of the transistor 200. For example, the material for the template layer may be selected so that the template layer and the gate dielectric 206 have perovskite structures with similar lattice parameters, e.g., within 0.5 Å of each other, or within a smaller range of each other (e.g., within 0.3 Å or 0.1 Å). More generally, when a first layer of a first crystalline material is epitaxially deposited over a second layer of a second crystalline material, it is beneficial for the first crystalline material to have a similar structure to the second crystalline material. The similarity of structure helps the first crystalline material form the proper crystal structure when deposited over the second crystalline material. The growing of a first crystalline material over a different, second crystalline material is referred to as heteroepitaxial growth.

In some embodiments, a seed layer (not specifically shown in FIG. 2) may be included between the support structure 202 and the gate electrode 204. The seed layer may be included in addition to or instead of the template layer discussed above. A seed layer may improve the structure of the electrode material in the gate electrode 204. In particular, growing the gate electrode 204 (e.g., a ruthenium or indium gate electrode) over a seed layer may reduce surface roughness of the upper surface of the gate electrode 204, which can improve crystallinity of the template layer (if included) and/or the crystallinity of the gate dielectric 206 formed over the gate electrode 204.

The seed layer may include, first example, a crystalline tantalum. In an embodiment, the tantalum seed layer has an amorphous structure. A tantalum seed layer may be advantageously chosen for its high melting point, such as greater than 1500 degrees C. A further advantage includes ease of patterning a seed layer including tantalum compared to other refractory metals, such as titanium or tungsten, that have similar melting points.

The channel material 208 may be composed of semiconductor material systems including, for example, N-type or P-type materials systems. In some embodiments, the transistor 200 may be a thin film transistor (TFT). A TFT is a special kind of a FET made by depositing a thin film of an active semiconductor material, as well as a dielectric layer (e.g., the dielectric material 206) and gate electrode (e.g., the gate electrode 204), over a supporting layer (e.g., the support structure 202) that may be a non-conducting layer. At least a portion of the active semiconductor material forms a channel of the TFT. If the transistor 200 is a TFT, the channel material 208 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 200 is a TFT, the channel material 208 may include one or more of tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, if the transistor 200 is a TFT, the channel material 208 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc.

As noted above, in certain embodiments, the channel material 208 may include a high mobility oxide semiconductor material, such as IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium, gallium, zinc, and oxide. One particular form of IGZO has the chemical formula $InGaO_3(ZnO)_5$. In other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In other embodiments, the channel material 208 may include other combinations of materials that include oxygen, such as combinations of oxygen and indium, gallium, and/or zinc. For example, the channel material 208 may include indium oxide, zinc oxide, gallium oxide, indium zinc oxide, or indium gallium oxide. In still other embodiments, the channel material 208 may include different oxide semiconductor materials, e.g., tin oxide, antimony oxide, indium tin oxide, titanium oxide, titanium oxynitride, ruthenium oxide, aluminum zinc oxide, tungsten oxide, cobalt oxide, copper oxide, nickel oxide, or niobium oxide.

Two S/D regions, not specifically shown in FIG. 2, may be formed in portions of the channel material 208 under the S/D contacts 210. The S/D regions may generally be formed using either an implantation/diffusion process or an etching/deposition process. In the former process, dopants such as boron, aluminum, antimony, phosphorous, or arsenic may be ion-implanted into the channel material to form the S/D regions. An annealing process that activates the dopants and causes them to diffuse further into the channel material 208 typically follows the ion implantation process. In the latter process, the channel material 208 may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions may be formed using one or more alternate semiconductor materials such as germanium or a group III-V material or alloy. And in further embodiments, one or more layers of metal and/or metal alloys may be used to form the S/D regions.

The S/D contacts 210 are coupled to the channel material 208, and in particular, to the S/D regions formed in the channel material 208. If S/D regions are formed in the channel 208, the S/D contacts 210 may be formed over the S/D regions, e.g., the first S/D contact 210a is coupled to the first S/D region, and the second S/D contact 210b is coupled to the second S/D region. An insulator material (not shown in FIG. 2) may be formed between the S/D contacts 210 and electrically separate the two S/D contacts 210a and 210b. The insulator material may be formed as a layer over the transistor 200 and similar transistors, where the insulator material layer further electrically separates transistors from one another. The S/D contacts 210 may be formed in the insulator material by patterning the S/D contacts 210 in the insulator layer and depositing the S/D contact material in the patterned regions.

In some embodiments, one or more layers of metal and/or metal alloys are used to form the S/D contacts 210. The S/D contacts 210 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 210 may include one or more electrically conductive alloys, oxides, or carbides of one or more metals. In some embodiments, the S/D contacts 210 may include a doped semiconductor, such as silicon or another semiconductor doped with an N-type dopant or a P-type dopant. Metals may provide higher conductivity, while doped semiconductors may be easier to pattern during fabrication. In some embodiments, the S/D contacts 210 may include both a semiconductor and a metal, e.g., an atomic layer deposition (ALD)-deposited doped oxide semiconductor followed by metal.

The S/D contacts 210 may have a thickness measured in the z-direction in the reference coordinate system shown in FIG. 2 of between 1 nanometers and 50 nanometers, including all values and ranges therein. In some embodiments, the S/D contacts 210 have a thickness between 30 and 40 nanometers.

Alternate Transistor Arrangements with High-k Perovskite Gate Dielectrics

FIGS. 3-6 illustrate four examples of alternate transistor arrangements that can be formed with a high-k perovskite gate dielectric. Each of the arrangements shown in FIGS. 3-6 includes at least some of the components and materials described with respect to FIG. 2, e.g., the support structure 202, the gate electrode 204, the gate dielectric 206, the channel material 208, and S/D contacts 210.

Figure 3:
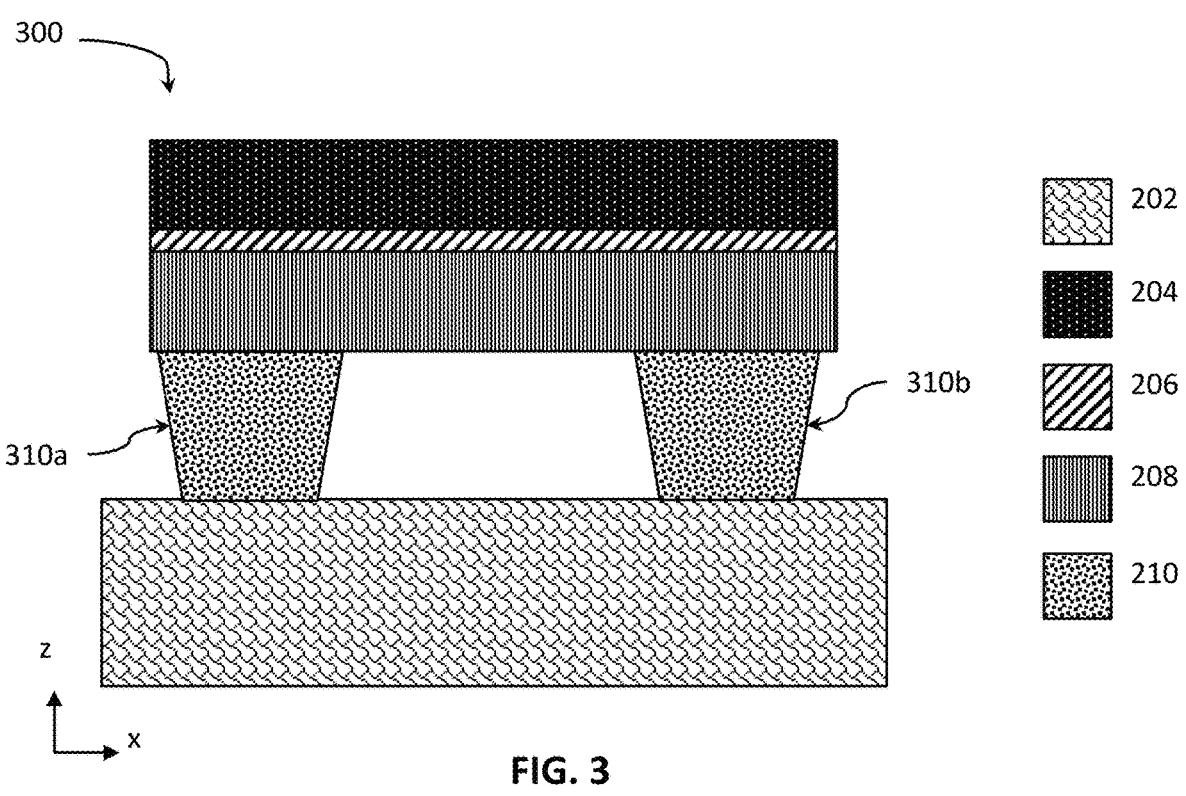
FIG. 3 is a cross-sectional view showing an example arrangement of a top-gated transistor having a perovskite gate dielectric, according to some embodiments of the present disclosure.

FIG. 3 is cross-sectional view showing an example arrangement of a top-gated transistor having a perovskite gate dielectric, according to some embodiments of the present disclosure. In this example, two S/D contacts 310a and 310b are formed over the support structure 202, the channel material 208 is formed over the S/D contacts 310a and 310b, the gate dielectric 206 is formed over the channel material 208, and the gate electrode 204 is formed over the gate dielectric 206.

As described with respect to FIG. 2, the gate dielectric 206 may be formed from a high-k perovskite, e.g., $SrTiO_3$, $Ba_xSr_{1-x}TiO_3$, or $LaAlO_3$. In some embodiments, a template layer, which may be similar to the template layer described with respect to FIG. 2, may be included between the channel material 208 and the gate dielectric 206. The template layer may provide a suitable template for growing a perovskite gate dielectric 206 with a desired crystal structure. Alternatively, the perovskite gate dielectric 206 may be grown separately and layer-transferred over the channel material 208.

Figure 4:
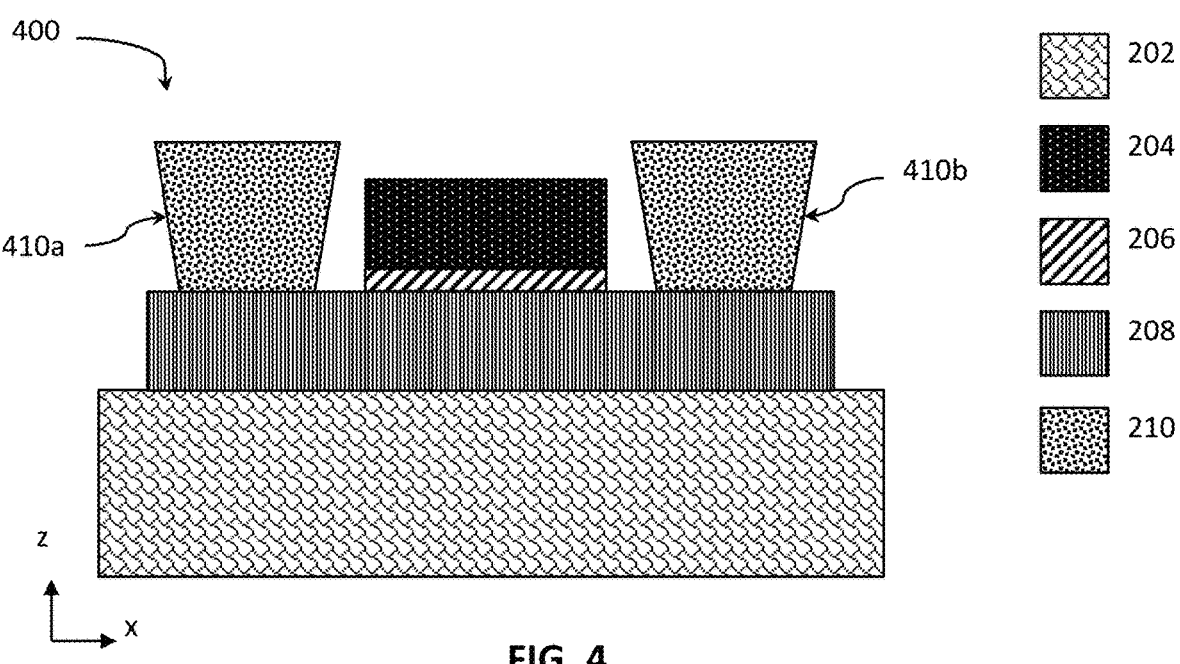
FIG. 4 is a cross-sectional view showing an example arrangement of a top-gated transistor with contacts at the top of the transistor, the transistor having a perovskite gate dielectric, according to some embodiments of the present disclosure.

FIG. 4 is cross-sectional view showing an example arrangement of a top-gated transistor with contacts at the top of the transistor, according to some embodiments of the present disclosure. In this example, the channel material 208 is formed over the support structure 202. Towards the center of the device in the x-direction, the gate dielectric 206 is formed over the channel material 208, and the gate electrode 204 is formed over the gate dielectric 206. On the two ends of the device in the x-direction, on either side of the gate dielectric 206 and the gate electrode 204, two S/D contacts 410a and 410b are formed over the channel material 208.

As described with respect to FIGS. 2 and 3, the gate dielectric 206 may be formed from a high-k perovskite, e.g., $SrTiO_3$, $Ba_xSr_{1-x}TiO_3$, or $LaAlO_3$. In some embodiments, a template layer, which may be similar to the template layer described with respect to FIG. 2, may be included between the channel material 208 and the gate dielectric 206. The template layer may provide a suitable template for growing a perovskite gate dielectric 206 with a desired crystal structure. Alternatively, the perovskite gate dielectric 206 may be grown separately and layer-transferred over the channel material 208.

Figure 5A:
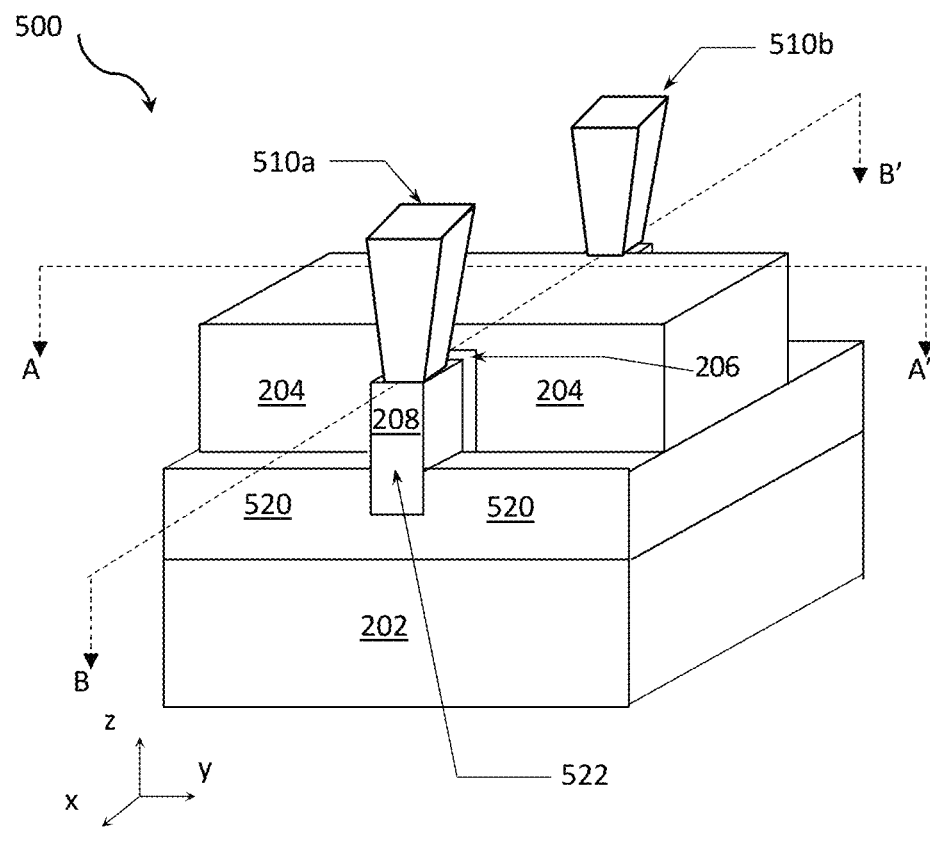
FIGS. 5A and 5B are perspective and cross-sectional views, respectively, of an example transistor implemented as a FinFET with a perovskite gate dielectric, according to some embodiments of the present disclosure.
Figure 5B:
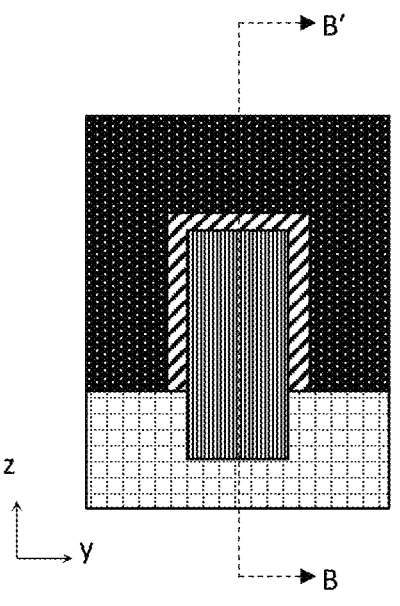
Figure 5B:
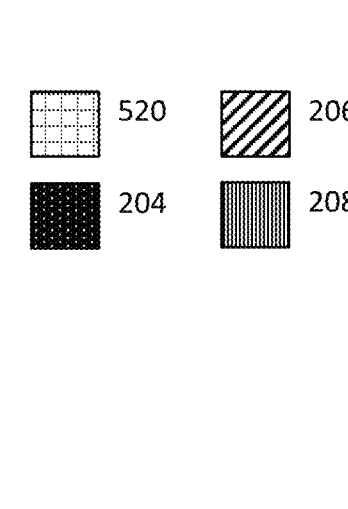

FIGS. 5A-5B are perspective and cross-sectional views, respectively, of an example transistor implemented as a FinFET with a perovskite gate dielectric, according to some embodiments of the present disclosure. FinFETs refer to transistors having a non-planar architecture where a fin, formed of one or more semiconductor materials, extends away from a base (where the term "base" refers to any suitable support structure on which a transistor may be built, e.g., a substrate). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode material and, optionally, a layer of a gate dielectric may be provided over the top and sides of the remaining upper portion of the fin (i.e., the portion above and not enclosed by the STI), thus wrapping around the upper-most portion of the fin. The portion of the fin over which the gate stack wraps around is typically referred to as a "channel portion" of the fin because this is where, during operation of the transistor, a conductive channel forms, and is a part of an active region of the fin. Two S/D regions may be provided on the opposite sides of the gate stack, forming a source and a drain terminal of a transistor. FinFETs may be implemented as "tri-gate transistors," where the name "tri-gate" originates from the fact that, in use, such transistors may form conducting channels on three "sides" of the fin. FinFETs potentially improve performance relative to single-gate transistors and double-gate transistors.

FIG. 5A is a perspective view, while FIG. 5B is a cross-sectional side view of a FinFET 500 with a perovskite gate dielectric, according to some embodiments of the disclosure. FIGS. 5A-5B illustrate the support structure 202, gate electrode 204, gate dielectric 206, and channel material 208, and S/D contacts 210 (labelled 510a and 510b in FIG. 5) as described above. As shown in FIGS. 5A-5B, when the transistor 500 is implemented as a FinFET, the FinFET 500 may further include a fin 522, and an STI material 520 enclosing the subfin portion of the fin 522. The cross-sectional side view of FIG. 5B is the view in the y-z plane of the example coordinate system x-y-z shown in FIG. 5A, with the cross-section of FIG. 5B taken across the fin 522 (e.g., along the plane shown in FIG. 5A as a plane AA'). On the other hand, the cross-sectional side view of FIG. 4 is the view in the x-z plane of the example coordinate system shown in FIG. 5A with the cross-section taken along the fin 522 for one example portion of the gate stack (e.g., along the plane shown in FIG. 5A and in FIG. 5B as a plane BB').

As shown in FIGS. 5A-5B, the fin 522 may extend away from the support structure 202 and may be substantially perpendicular to the support structure 202. The fin 522 may include one or more semiconductor materials, e.g. a stack of semiconductor materials, so that the upper-most portion of the fin (namely, the portion of the fin 522 enclosed by the gate electrode 204 and gate dielectric 206) may serve as the channel region of the FinFET 500. Therefore, the upper-most portion of the fin 522 may be formed of the channel material 208 as described above.

The subfin of the fin 522 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For some example N-type transistor embodiments, the subfin portion of the fin 522 may be a III-V material having a band offset (e.g., conduction band offset for N-type devices) from the channel portion. Example materials, include, but are not limited to, GaAs, GaSb, GaAsSb, GaP, InAlAs, GaAsSb, AlAs, AlP, AlSb, and AlGaAs. In some N-type transistor embodiments of the FinFET 500 where the channel portion of the fin 522 (e.g., the channel portion) is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 522 are each, or include, group IV semiconductors (e.g., Si, Ge, SiGe). The subfin of the fin 522 may be a first elemental semiconductor (e.g., Si or Ge) or a first SiGe alloy (e.g., having a wide bandgap). For some example P-type transistor embodiments, the subfin of the fin 522 may be a group IV material having a band offset (e.g., valance band offset for P-type devices) from the channel portion. Example materials, include, but are not limited to, Si or Si-rich SiGe. In some P-type transistor embodiments, the subfin of the fin 522 is Si and at least a portion of the subfin may also be doped with impurities (e.g., N-type) to a higher impurity level than the channel portion.

As further shown in FIGS. 5A-5B, the STI material 520 may enclose portions of the sides of the fin 522. A portion of the fin 522 enclosed by the STI 520 forms a subfin. In various embodiments, the STI material 520 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 520 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack (i.e., the gate dielectric 206 and gate electrode 204) may wrap around the upper portion of the fin 522 (the portion above the STI 520), as shown in FIGS. 5A-5B, with a channel portion of the fin 522 corresponding to the portion of the fin 522 wrapped by the gate stack as shown in FIGS. 5A-5B. In particular, the gate dielectric 206 may wrap around the upper-most portion of the fin 522, and the gate electrode 204 may wrap around the gate dielectric 206. The interface between the channel portion and the subfin portion of the fin 522 is located proximate to where the gate electrode 204 ends.

In some embodiments, the FinFET 500 may have a gate length, GL, (i.e. a distance between the first S/D region and the second S/D region in the channel material 208), a dimension measured along the fin 522 in the direction of the x-axis of the example reference coordinate system x-y-z shown in FIG. 4 and FIGS. 5A-5B, which may, in some embodiments, be between about 5 and 40 nanometers, including all values and ranges therein (e.g. between about 22 and 35 nanometers, or between about 20 and 30 nanometers). The fin 522 may have a thickness, a dimension measured in the direction of the y-axis of the reference coordinate system x-y-z shown in FIGS. 5A-5B, that may, in some embodiments, be between about 5 and 30 nanometers, including all values and ranges therein (e.g. between about 7 and 20 nanometers, or between about 10 and 15 nanometers). The fin 522 may have a height, a dimension measured in the direction of the z-axis of the reference coordinate system x-y-z shown in FIG. 4, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 522 illustrated in FIGS. 5A-5B is shown as having a rectangular cross-section in a y-z plane of the reference coordinate system shown, the fin 522 may instead have a cross-section that is rounded or sloped at the "top" of the fin 522, and the gate stack may conform to this rounded or sloped fin 522. In use, the FinFET 500 may form conducting channels on three "sides" of the channel portion of the fin 522, potentially improving performance relative to single-gate transistors (which may form conducting channels on one "side" of a channel material or substrate) and double-gate transistors (which may form conducting channels on two "sides" of a channel material or substrate).

The S/D contacts 510a and 510b are electrically connected to the channel material 208 and extend in the same vertical direction with respect to the fin 522. In another example, one of the S/D contacts (e.g., the first S/D contact 510a) may be electrically connected to a first S/D region formed in the channel material 208 and extend from the first S/D region towards the support structure 202, thus forming a back-side S/D contact for the FinFET 500. In still another implementation, both the first S/D contact 510a and the second S/D contact 510b extend from the first and second S/D region towards the support structure 202, thus forming two back-side S/D contacts for the FinFET 500, similar to the illustration of FIG. 3.

Figure 6:
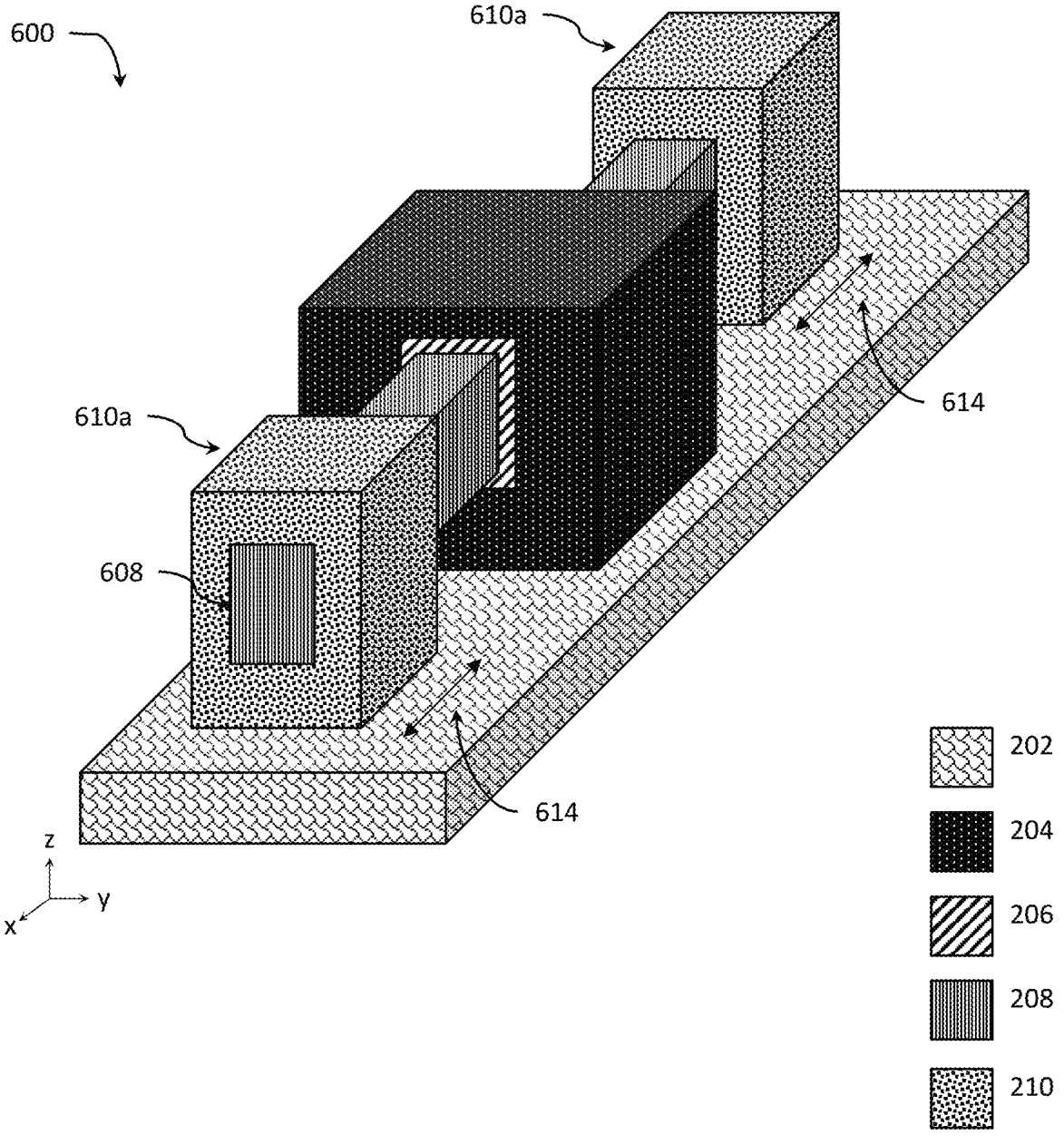
FIG. 6 is a perspective view of an example gate all-around transistor with a perovskite gate dielectric, according to some embodiments of the present disclosure.

FIG. 6 is a perspective view of an example gate all-around (GAA) transistor with a perovskite gate dielectric, according to some embodiments of the present disclosure. A GAA transistor, also referred to as a surrounding-gate transistor, has a gate material that surrounds a channel region on all sides. GAA transistors may be nanoribbon-based or nanowire-based, and can also be referred to as a nanoribbon transistor or a nanowire transistor. In a nanoribbon transistor, a gate stack that may include one or more gate electrode materials and a gate dielectric may be provided around a portion of an elongated semiconductor structure called "nanoribbon", forming the gate stack on all sides of the nanoribbon. The portion of the nanoribbon around which the gate stack wraps around is referred to as a "channel" or a "channel portion." A semiconductor material of which the channel portion of the nanoribbon is formed is commonly referred to as a "channel material." A source region and a drain region can be provided on the opposite ends of the nanoribbon, on either side of the gate stack, forming, respectively, a source and a drain of such a transistor. GAA transistors, such as nanoribbon and nanowire transistors, may provide advantages compared to other transistors having a non-planar architecture, such as FinFETs.

FIG. 6 is a perspective view of an example nanoribbon transistor 600. The transistor 600 may be implemented as either as a stand-alone transistor or included as a part of a memory cell (e.g., the transistor 600 may be used as the access transistor 110). The arrangement shown in FIG. 6 is intended to show relative arrangements of some of the components therein, and that the arrangement with the transistor 600, or portions thereof, may include other components that are not illustrated (e.g., electrical contacts to the source and the drain of the transistor 600, additional layers such as a spacer layer, around the gate electrode of the transistor 600, etc.). For example, although not specifically illustrated in FIG. 6, a dielectric spacer may be provided between the source contact and the gate stack as well as between the drain contact and the gate stack in order to provide electrical isolation between the source, gate, and drain electrodes. In another example, although not specifically illustrated in FIG. 6, at least portions of the transistor 600 may be surrounded in an insulator material, such as any suitable interlayer dielectric (ILD) material.

Turning to the details of FIG. 6, the transistor 600 may include the channel material 208, described above with respect to FIG. 2, which is formed as a nanoribbon 608. The nanoribbon 608 provided over a base, e.g., the support structure 202 as described above with respect to FIG. 2. The nanoribbon 608 may take the form of a nanowire or nanoribbon, for example. A gate stack including the gate electrode 204 and the gate dielectric 206, described above, may wrap entirely or almost entirely around a portion of the nanoribbon 608 with the active region of the channel material 208 of the nanoribbon 608 corresponding to the portion of the nanoribbon 608 wrapped by the gate electrode 204 and the gate dielectric 206. For example, the gate dielectric 206 may wrap around a transversal portion of the nanoribbon 608 and the gate electrode 204 may wrap around the gate dielectric 206. In some embodiments, the gate stack may fully encircle the nanoribbon 608.

As further shown in FIG. 6, the nanoribbon 608 may include a first S/D contact 610*a* and a second S/D contact 610*b* on either side of the gate stack, thus realizing a transistor. The S/D contacts 610 may be made out of any of the materials described with respect to the S/D contacts 210. The S/D contacts 610 may be formed on any side or along multiple sides of the nanoribbon 608.

Although the nanoribbon 608 illustrated in FIG. 6 is shown as having a square cross-section, the nanoribbon 608 may instead have a cross-section that is rectangular but not square, a cross-section that is rounded at corners or otherwise irregularly shaped, and the gate stack formed around the nanoribbon 608 may conform to the shape of the nanoribbon 608. In use, the GAA transistor 600 may form conducting channels on more than three "sides" of the nanoribbon 608, potentially improving performance relative to FinFETs. Furthermore, although FIG. 6 depicts an embodiment in which the longitudinal axis of the nanoribbon 608 runs substantially parallel to a plane of the support structure 202, this need not be the case; in other embodiments, the nanoribbon 608 may be oriented, e.g., "vertically" so as to be perpendicular to a plane of the support structure 202.

While the nanoribbon 608 illustrated within the transistor 600 is depicted as a solid nanoribbon with a square cross-section, in other embodiments, a GAA transistor may include multiple stacked nanoribbons, e.g., multiple thinner nanoribbon components stacked next to or on top of each other, with spaces between adjacent nanoribbon components. The dielectric material 206 and the gate electrode 204 may fill the spaces between adjacent nanoribbon components.

In some embodiments, the transistor 600 may have a gate length (i.e., a distance between the first and second S/D contacts 610), a dimension measured along the nanoribbon 608, between about 5 and 40 nanometers, including all values and ranges therein (e.g., between about 22 and 35 nanometers, or between about 20 and 30 nanometers). In some embodiments, an area of a transversal cross-section of the nanoribbon 608 may be between about 25 and 10000 square nanometers, including all values and ranges therein (e.g., between about 25 and 1000 square nanometers, or between about 25 and 500 nanometers).

Example Four-Terminal Transistor with High-k Perovskite Gate Dielectric

Figure 7:
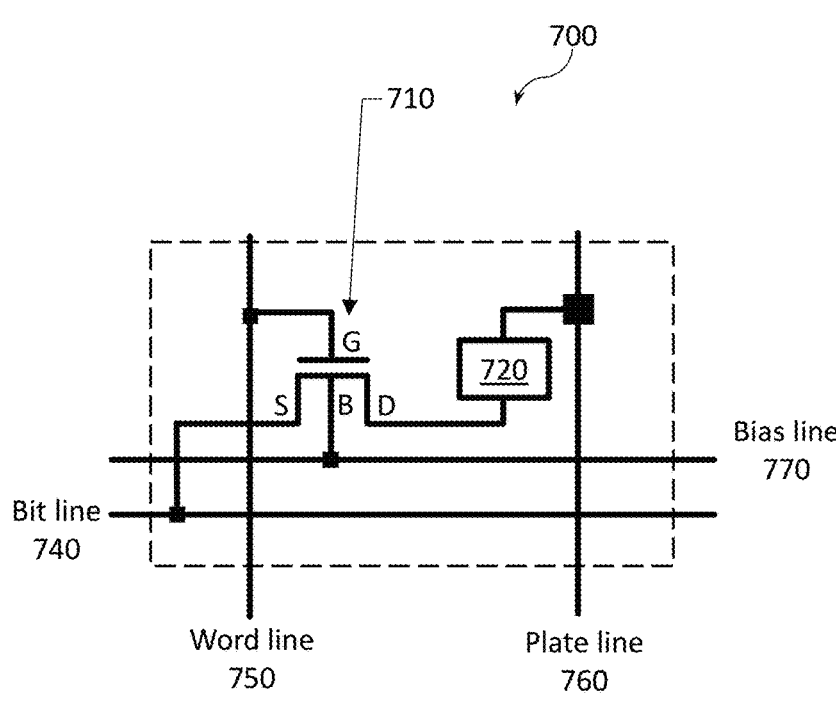
FIG. 7 is an electrical circuit diagram of an example 1T-1X memory cell with a four-terminal transistor, according to some embodiments of the present disclosure.

FIG. 7 is an electrical circuit diagram of an example 1T-1X memory cell 700 with a four-terminal transistor, according to some embodiments of the present disclosure. As shown, the 1T-1X cell 700 may include an access transistor 710 and a memory element 720. The access transistor 710 has a gate terminal, a source terminal, and a drain terminal, indicated in the example of FIG. 7 as terminals G, S, and D, respectively. The gate terminal of the access transistor 710 may be coupled to a word line (WL) 750, one of the S/D terminals of the access transistor 710 may be coupled to a bit line (BL) 740, and the other one of the S/D terminals of the access transistor 710 may be coupled to a first terminal of the memory element 720. As also shown in FIG. 7, the memory element 720 may have a second terminal, e.g., if the memory element 720 is a capacitor, an electrode of the capacitor is coupled to a plate line (PL) 760. The WL, BL, and PL are similar to the WL, BL, and PL described above with respect to FIG. 1. The gate terminal may have a first voltage setting for turning on the access transistor 710, and a second, different voltage setting for turning off the access transistor 710.

In the example shown in FIG. 7, the access transistor 710 includes a fourth terminal indicated as terminal B and referred to as a body terminal. The body terminal may be coupled to a bias line 770 as shown in FIG. 7. The bias line 770 is controlled independently from the BL 740, WL 750, and PL 760, e.g., different voltages can be separately applied to each of the BL 740, WL 750, PL 760, and bias line 770. The body terminal is coupled to the channel material of the access transistor 710. A voltage applied via the bias line 770 to the body terminal adjusts the threshold voltage of the access transistor 710. For an example where the access transistor 710 is an N-type transistor (e.g., an N-type TFT), if a baseline threshold voltage (i.e., a threshold voltage if no voltage is applied to the body terminal) for turning on the access transistor 710 is +2V, and +0.5V is applied to the body terminal via the bias line 770, this reduces the threshold voltage for turning on the access transistor at the gate to +1.5 V. The +0.5V voltage applied to the body terminal may also increase a magnitude of the threshold voltage for turning the access transistor 710 off, e.g., lowering the threshold voltage to turn off the access transistor 710 from a baseline of −2V to an adjusted threshold voltage of −2.5V.

In this example, a positive bias voltage (e.g., +0.5V applied at the body terminal) can reduce leakage in the access transistor 710. Alternatively, a negative bias voltage can be applied via the bias line 770. In an N-type transistor, a negative bias voltage (e.g., −0.5V applied to the body terminal) increases the threshold voltage for turning on the access transistor at the gate (e.g., from +2.0 to +2.5 V) and increases the threshold voltage to turn off the access transistor at the gate (e.g., from −2.0V to −1.5V).

A P-type transistor (e.g., a P-type TFT) exhibits an opposite effect from the voltage applied to the body terminal. In a P-type transistor, if a positive voltage (e.g., +0.5V) is applied to the body terminal, this increases the threshold voltages (e.g., from a baseline of −2.0V to turn off the transistor to −1.5V, and from a baseline of +2.0V to turn on the transistor to +2.5V). Conversely, if a negative voltage (e.g., −0.5V) is applied to the body terminal of a P-type transistor, this decreases the threshold voltages (e.g., from a baseline of −2.0V to turn off the transistor to −2.5V, and from a baseline of +2.0V to turn on the transistor to +1.5V).

Figure 8:
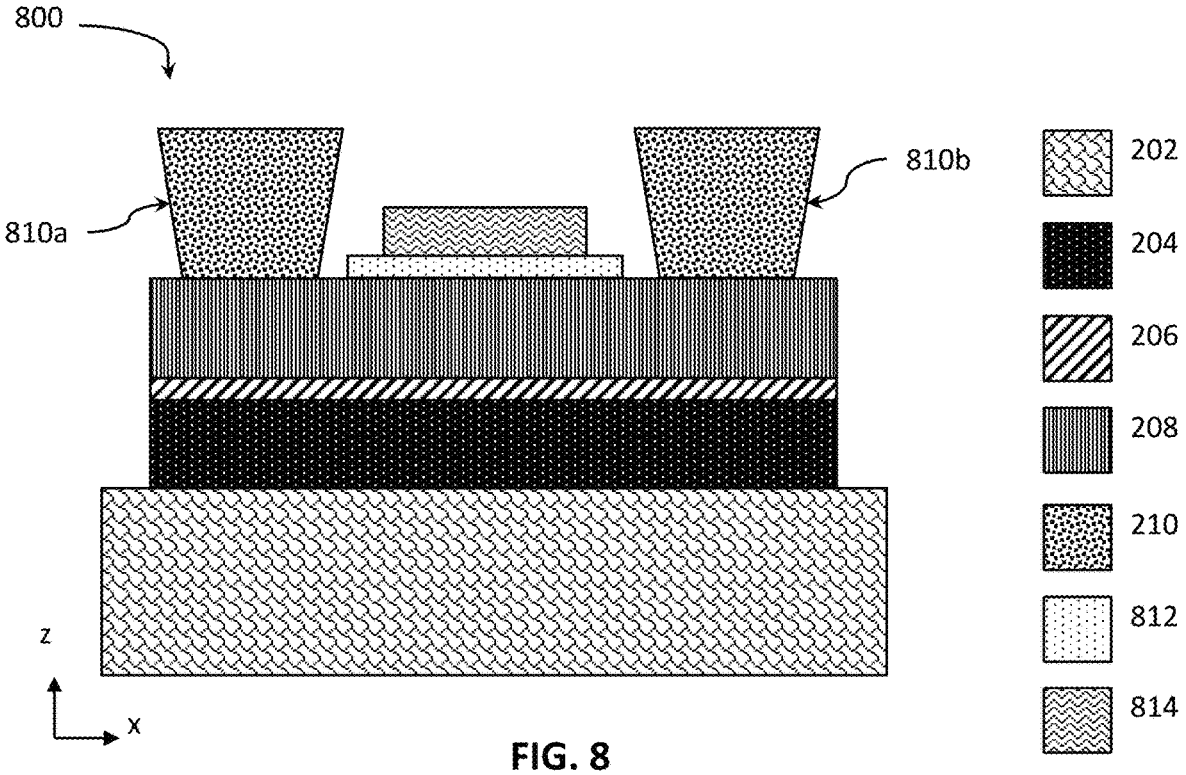
FIG. 8 is a cross-sectional view showing an example arrangement of a four-terminal transistor having a perovskite gate dielectric, according to some embodiments of the present disclosure.

FIG. 8 is a cross-sectional view showing an example arrangement of a four-terminal transistor 800 having a perovskite gate dielectric, according to some embodiments of the present disclosure. The transistor 800 is one example implementation of the access transistor 710 shown in FIG. 7. In other embodiments, the transistor 800 may not be coupled to memory element 720 to form a 1T-1X memory cell, e.g., the transistor 800 may be used in a compute logic device.

The transistor 800 is formed over a support structure 202, which is similar to the support structure 202 described with respect to FIG. 2. In this example, the transistor 800 includes two contacts 810*a* and 810*b*, one of which (e.g., contact 810*b*) may be coupled to a memory element 720 for storing a bit of data. The transistor 800 further includes a gate electrode 204, a gate dielectric 206, and a channel material 208. Each of the gate electrode 204, gate dielectric 206, and channel material 208 may be similar to the materials described with respect to FIG. 2, and the same patterns and reference numerals used with respect to FIG. 2 are used in FIG. 8. For example, the gate electrode 204 may be formed from ruthenium, indium, or titanium nitride. The gate dielectric 206 may be formed from, for example, SrTiO$_3$, (Ba,Sr)TiO$_3$, or LaAlO$_3$. As described with respect to FIG. 2, in some embodiments, a template layer may be formed between the gate electrode 204 and the gate dielectric 206 to improve the crystal structure of the gate dielectric 206. The template layer may be a perovskite oxide that includes, for example, oxygen, strontium, and at least one additional metals, such as titanium, ruthenium, scandium, rhodium, hafnium, barium, chromium, or iron.

The gate electrode 204 may be coupled to the WL 750, which may be coupled to a row of similar memory cells. As described with respect to FIG. 2, the channel 208 may include a first S/D region (not specifically shown in FIG. 8), which is coupled to the first S/D contact 810*a*, and a second S/D region (also not specifically shown in FIG. 8), which is coupled to the second S/D contact 810*b*. The first S/D contact 810*a* may be coupled to the BL 740, and the BL 740 may be coupled to a column of similar memory cells. The second S/D contact 810*b* may coupled to one terminal of the memory element 720, as shown in FIG. 7.

In one particular embodiment, the channel material 208 included in the transistor 800 is a TFT channel material, as described above with respect to FIG. 2. For example, in some embodiments, the channel material 208 may include a combination of materials that include oxygen, such as combinations of oxygen and indium, gallium, and/or zinc. As described above, with repeated use of the transistor 800, the electrical properties of the channel material 208 can change. For example, the drive current in a TFT channel can be reduced after repeated on-off cycling of the transistor 800. This impacts the threshold voltages for turning the transistor 800 on and off. To tune the threshold voltages of the transistor 800, the transistor 800 includes a second electrode 814 coupled via a second dielectric 812 to the channel material 208. In this example, the second dielectric 812 and second electrode 814 are formed over the channel material 208, on an opposite side of the channel material 208 relative to the gate dielectric 206 and the gate electrode 204. The second dielectric 812 and second electrode 814 are formed between the first and second S/D contacts 810*a* and 810*b*.

The second dielectric 812 may be a perovskite dielectric, such as the dielectric perovskite materials described with respect to the gate dielectric 206, or a non-perovskite dielectric material. For example, the second dielectric 812 may be hafnium oxide or another high-k oxide material. For example, in various embodiments, the second dielectric 812 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the second dielectric 812 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the second dielectric 812 during manufacture of the transistor 800 to improve the quality of the second dielectric 812.

The second electrode 814 may be formed from, for example, ruthenium or titanium nitride. In other examples, the second electrode 814 may be formed from other suitably conductive materials, such as one or more metals or metal alloys, with metals such as palladium, platinum, cobalt, nickel, hafnium, zirconium, titanium, tantalum, and aluminum.

Example Operation of a Four-Terminal Transistor

As noted above, the baseline threshold voltages for the transistor 710 or 800 may change over time, e.g., based on electrical changes in the channel material 208 that occur with use. In some embodiments, the bias voltage applied to the body terminal B (e.g., the voltage applied to the second electrode 814) via the bias line 770 can be changed over time, to account for changes to the baseline threshold voltage. As one example, when the transistor 800 is new, the baseline threshold voltage to turn on the transistor 800 may be +2V, and the baseline threshold voltage to turn off the transistor 800 may be −2V. For the new transistor, no voltage may be applied to the bias line 770. After a certain number of cycles and/or certain period of time, the baseline threshold voltage to turn on the transistor 800 may shift to +1.5V, and the baseline threshold voltage to turn off the transistor 800 may shift to −2.5V. To account for these shifts, for an N-type transistor, a bias voltage of +0.5V may be applied to the second electrode 814, to adjust the threshold voltage to turn on the transistor 800 back up to +2V, and to adjust the threshold voltage to turn off the transistor 800 back up to −2V.

In some embodiments, a transistor, or more generally, a memory array of similar transistors, may be characterized prior to usage to determine bias voltage settings over time. For example, a memory array may be programmed to cause a bias voltage to be applied to the body terminals of the access transistors after a pre-determined period of time or pre-determined amount of usage (e.g., a set number of cycles). As another example, a fixed bias voltage may be applied from the first usage of the memory array. As still another example, changes to the threshold voltage of the access transistor (or a set of connected access transistors) may be sensed during usage of the memory array, and the bias voltage may be set based on the detected threshold voltage of the access transistor.

Figure 9:
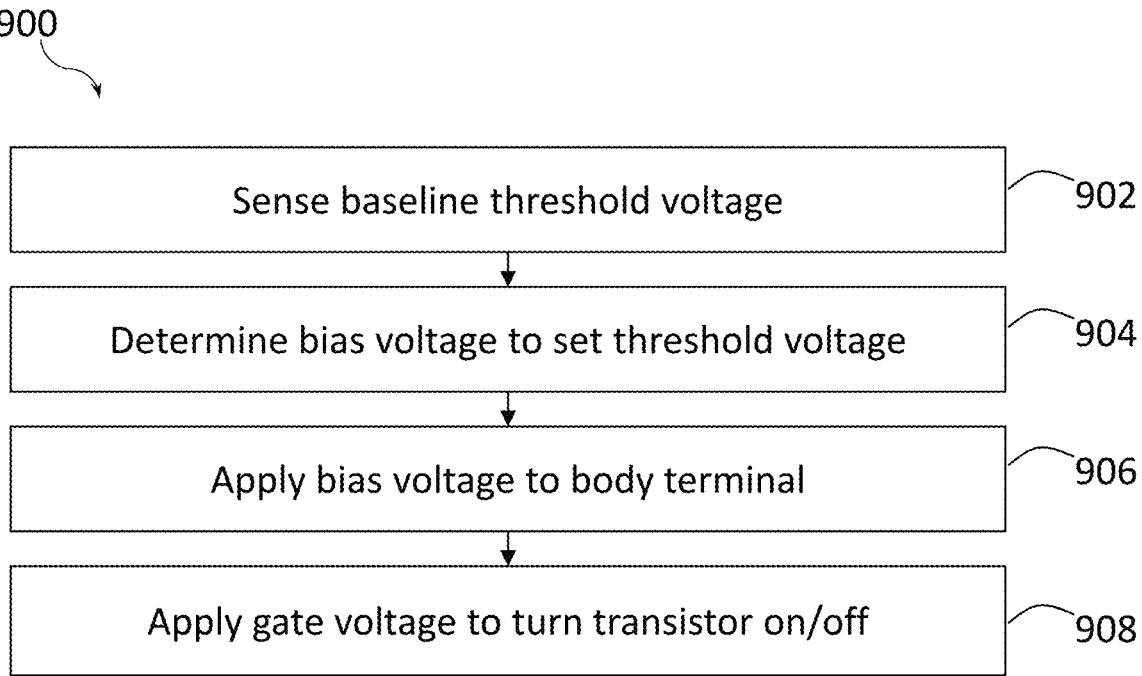
FIG. 9 is a flowchart illustrating a method for operating a four-terminal transistor, according to some embodiments of the present disclosure.

FIG. 9 is a flowchart illustrating one example method 900 for operating a four-terminal transistor, such as the four-terminal transistor 710 or 800, according to some embodiments of the present disclosure. The method may be performed by control circuitry in a device that includes the four-terminal transistor, e.g., control circuitry in a memory device.

The method 900 begins with sensing 902 a baseline threshold voltage, e.g., the threshold voltage to turn the transistor 710 or 800 on when no voltage signal is applied to the second electrode 814 (e.g., the second electrode 814 is floating). In some embodiments, sensing circuitry in the memory device senses a first baseline threshold voltage to turn on the transistor and a second baseline threshold voltage to turn off the transistor.

The method proceeds with determining 904 a bias voltage to apply to the second electrode 814, where the bias voltage sets or adjusts the threshold voltage for turning on the transistor and/or turning off the transistor. For example, if the sensed baseline threshold voltage to turn on the transistor is +1.3V, but a desired threshold voltage for turning on the transistor is +1.0V, circuitry in the memory device may determine to apply a bias voltage of 0.3V to second electrode 814. The same bias voltage may be applied to many or all transistors within the memory device.

The method proceeds with applying 906 the bias voltage to the body terminal, e.g., to the second electrode 814. The bias voltage may be applied by a bias line, e.g., the bias line 770 shown in FIG. 7. A bias voltage may be applied across a column of memory cells (e.g., if the bias line 770 is oriented as shown in FIG. 7). In other embodiments, the bias voltage may be applied across a row of memory cells (e.g., if the bias line 770 is oriented with the word line 750), or the bias voltage may be applied across an array of rows and columns of memory cells.

The method proceeds with applying 908 a gate voltage to turn the transistor on or off. In some embodiments, as the electrical properties of the channel material 208 change over time, the same gate voltages may be used to turn the transistor on or off, while the bias voltage applied to the body terminal adjusts the threshold voltage(s) to account for the changing electrical properties.

Example Devices

The transistor devices with high-k perovskite gate dielectrics disclosed herein may be included in any suitable electronic device. FIGS. 10-13 illustrate various examples of apparatuses that may include the transistor devices with high-k perovskite gate dielectrics disclosed herein.

Figure 10A:
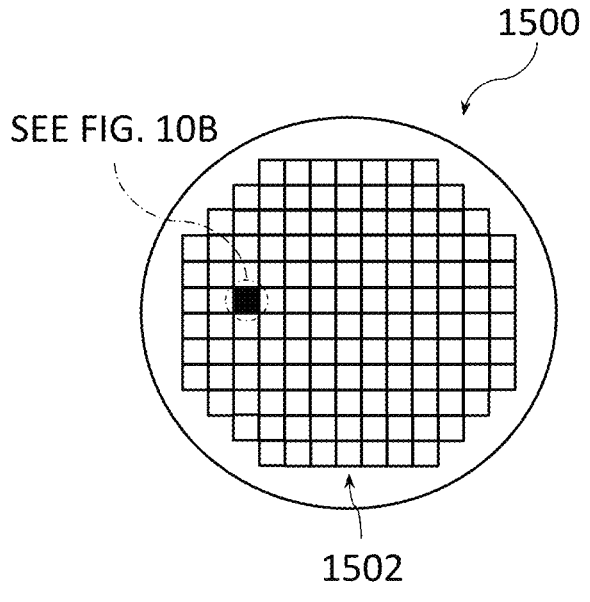
Figure 10B:
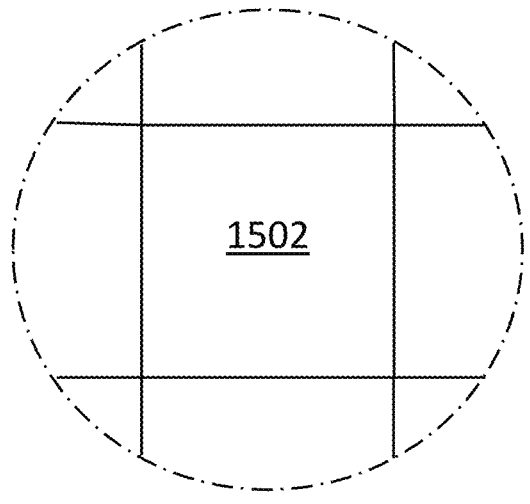

FIGS. 10A and 1013 are top views of a wafer and dies that include one or more IC structures with transistor devices with high-k perovskite gate dielectrics in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIG. 1, 2, or 4-6, or any further embodiments of the IC structures described herein). After the fabrication of the semiconductor product is complete (e.g., after manufacture of one or more IC structures with one or more transistor devices with high-k perovskite gate dielectrics as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more transistor devices with high-k perovskite gate dielectrics as disclosed herein may take the form of the wafer 1500 (e.g., not singulated) or the form of the die 1502 (e.g., singulated). The die 1502 may include one or more transistors (e.g., one or more of the transistors 1640 of FIG. 11, discussed below) and/or supporting circuitry to route electrical signals to the transistors, as well as any other IC components (e.g., one or more transistor devices with high-k perovskite gate dielectrics). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 11:
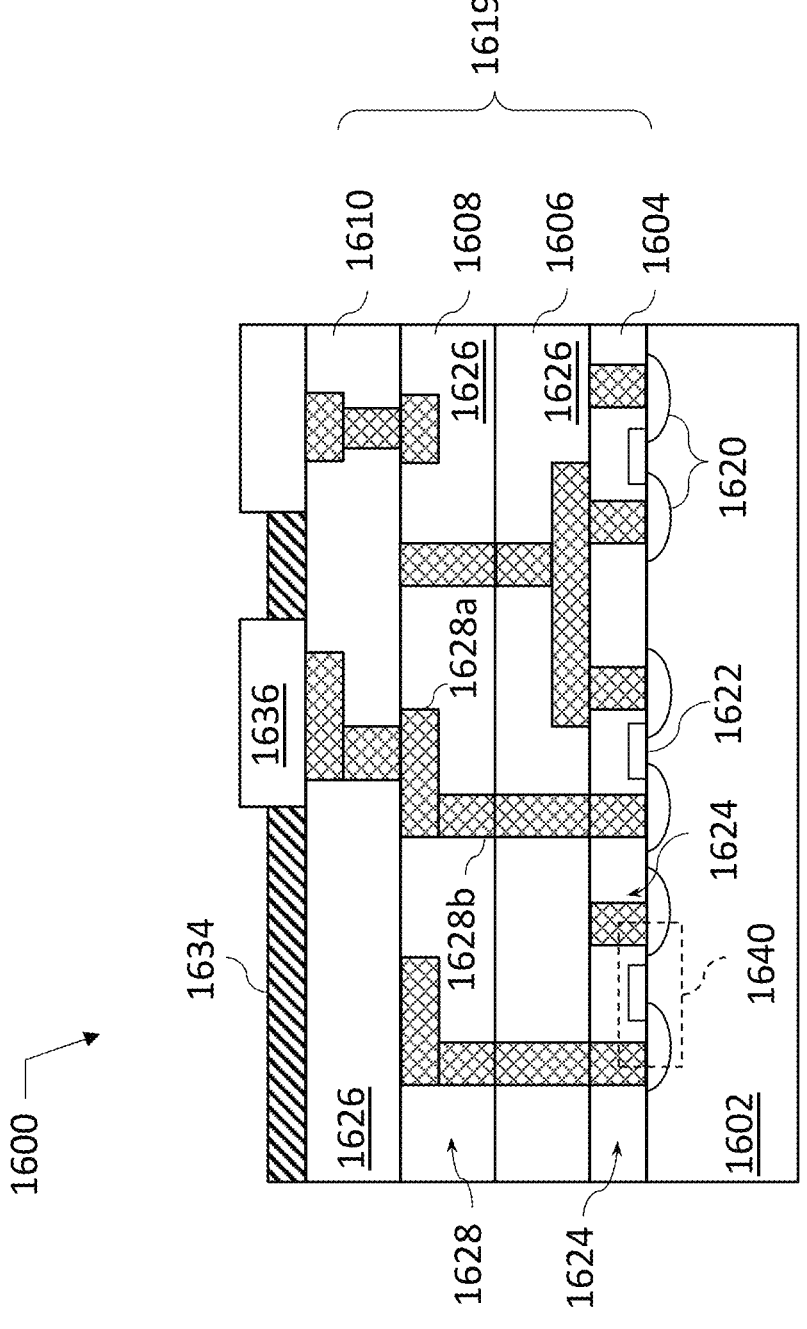
FIG. 11 is a cross-sectional side view of an IC device that may include a transistor having a perovskite gate dielectric in accordance with any of the embodiments disclosed herein.

FIG. 11 is a cross-sectional side view of an IC device 1600 that may include one or more transistors with high-k perovskite gate dielectrics in accordance with any of the embodiments disclosed herein. The IC device 1600 may be formed on a substrate 1602 (e.g., the wafer 1500 of FIG. 10A) and may be included in a die (e.g., the die 1502 of FIG. 10B). The substrate 1602 may be any substrate as described herein. The substrate 1602 may be part of a singulated die (e.g., the dies 1502 of FIG. 10B) or a wafer (e.g., the wafer 1500 of FIG. 10A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The IC device 1600 may include one or more transistors with high-k perovskite gate dielectrics at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 11 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 11). Although a particular number of interconnect layers 1606-1610 is depicted in FIG. 11, embodiments of the present disclosure include IC devices having more or fewer interconnect layers than depicted.

In some embodiments, the interconnect structures 1628 may include trench contact structures 1628a (sometimes referred to as "lines") and/or via structures 1628b (sometimes referred to as "holes") filled with an electrically conductive material such as a metal. The trench contact structures 1628a may be arranged to route electrical signals in a direction of a plane that is substantially parallel with a surface of the substrate 1602 upon which the device layer 1604 is formed. For example, the trench contact structures 1628a may route electrical signals in a direction in and out of the page from the perspective of FIG. 11. The via structures 1628b may be arranged to route electrical signals in a direction of a plane that is substantially perpendicular to the surface of the substrate 1602 upon which the device layer 1604 is formed. In some embodiments, the via structures 1628b may electrically couple trench contact structures 1628a of different interconnect layers 1606-1610 together.

The interconnect layers 1606-1610 may include a dielectric material 1626 disposed between the interconnect structures 1628, as shown in FIG. 11. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628a and/or via structures 1628b, as shown. The trench contact structures 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628b to couple the trench contact structures 1628a of the second interconnect layer 1608 with the trench contact structures 1628a of the first interconnect layer 1606. Although the trench contact structures 1628a and the via structures 1628b are structurally delineated with a line within each interconnect layer (e.g., within the second interconnect layer 1608) for the sake of clarity, the trench contact structures 1628*a* and the via structures 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 12:
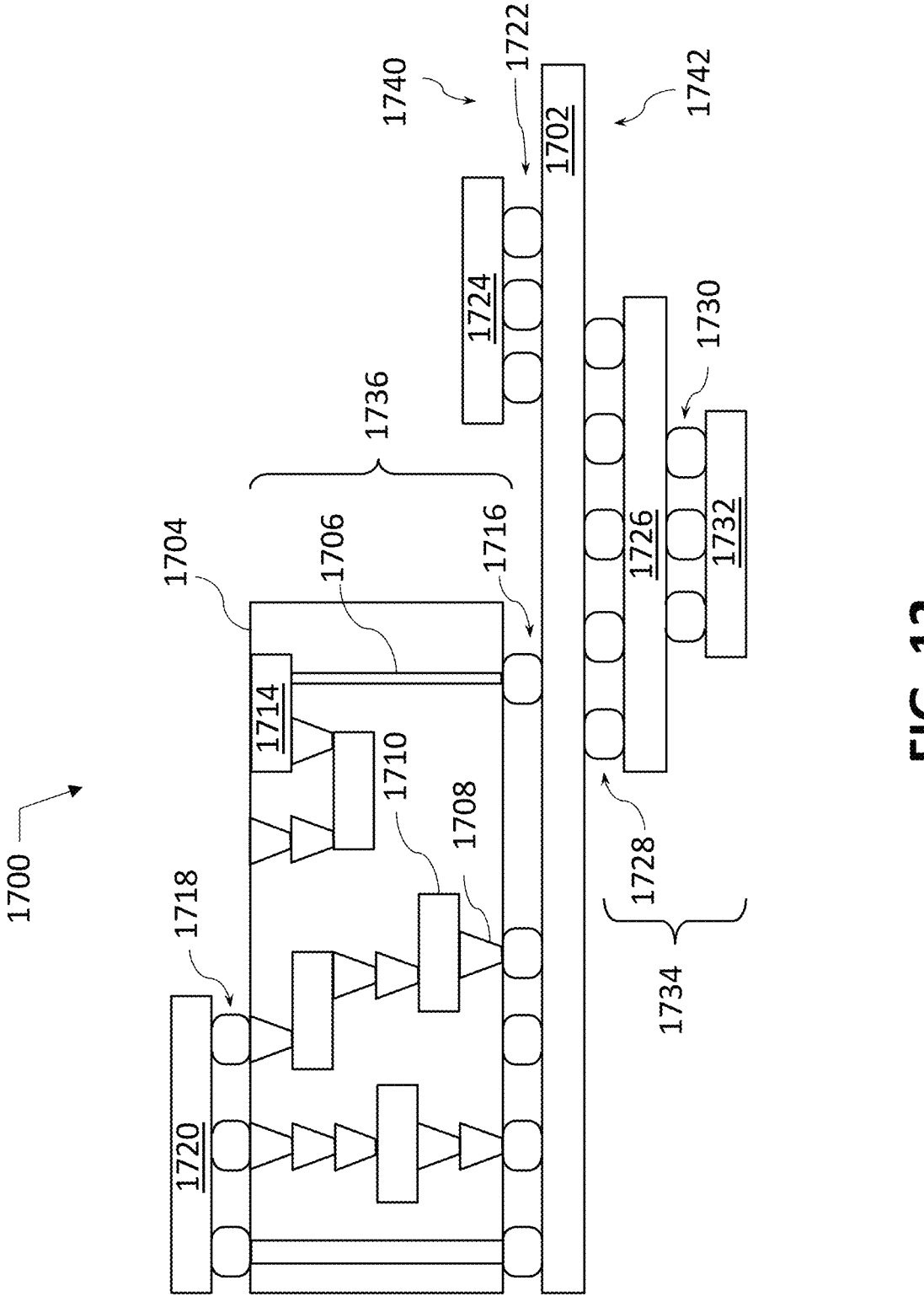
FIG. 12 is a cross-sectional side view of an IC device assembly that may include a transistor having a perovskite gate dielectric in accordance with any of the embodiments disclosed herein.

FIG. 12 is a cross-sectional side view of an IC device assembly 1700 that may include components having or being associated with (e.g., being electrically connected by means of) one or more transistors with high-k perovskite gate dielectrics in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the transistors with high-k perovskite gate dielectrics disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG.

12, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 10B), an IC device (e.g., the IC device 1600 of FIG. 11), or any other suitable component. In some embodiments, the IC package 1720 may include transistors with high-k perovskite gate dielectrics, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 12, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
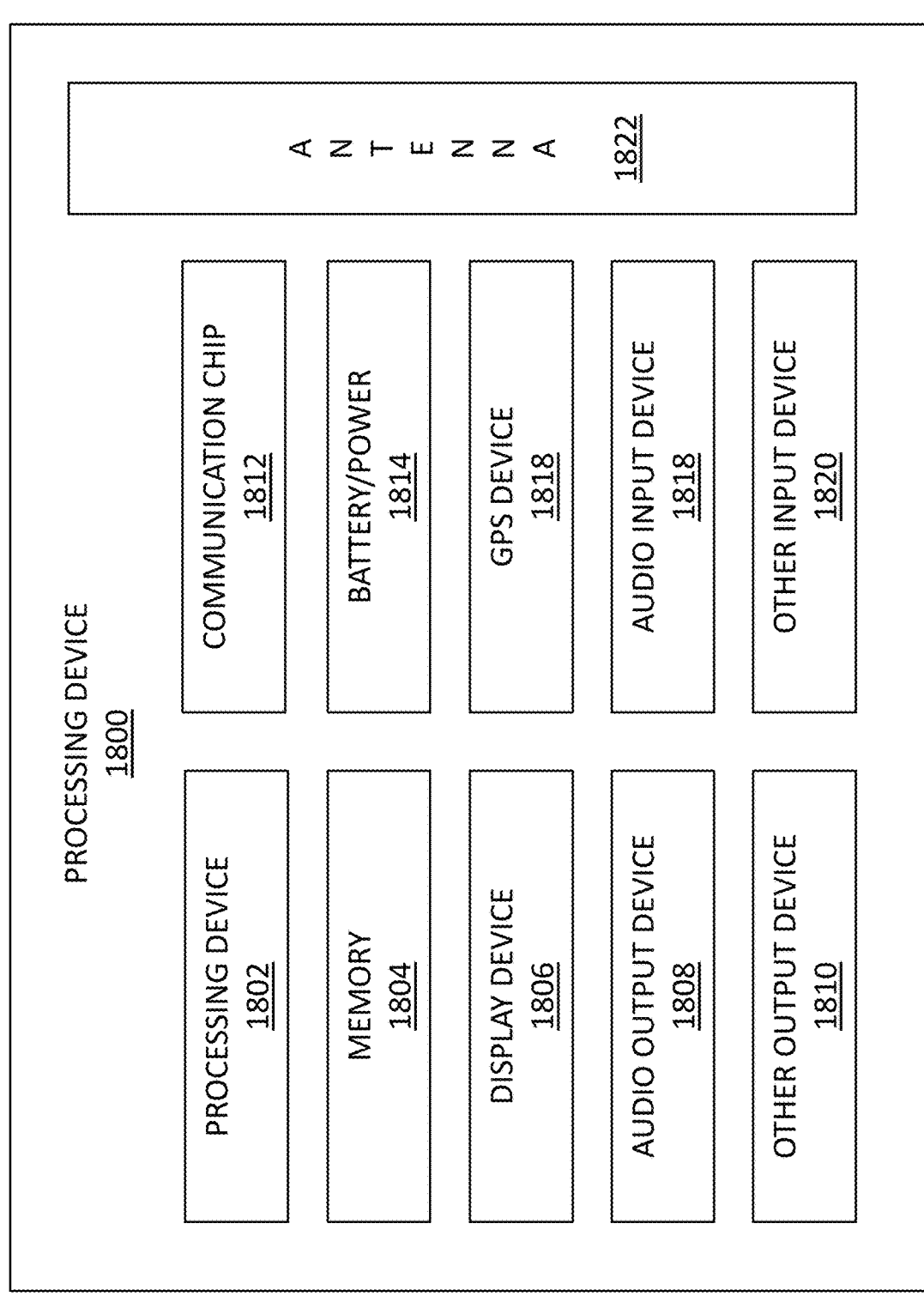
FIG. 13 is a block diagram of an example computing device that may include a transistor having a perovskite gate dielectric in accordance with any of the embodiments disclosed herein.

FIG. 13 is a block diagram of an example computing device 1800 that may include one or more components including one or more transistors with high-k perovskite gate dielectrics in accordance with any of the embodiments disclosed herein. For example, any suitable ones of the components of the computing device 1800 may include a die (e.g., the die 1502 of FIG. 10B) having transistors with high-k perovskite gate dielectrics as described herein. Any one or more of the components of the computing device 1800 may include, or be included in, an IC device 1600 (FIG. 11). Any one or more of the components of the computing device 1800 may include, or be included in, an IC device assembly 1700 (FIG. 12).

A number of components are illustrated in FIG. 13 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 13, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-M RAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a net-book computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides an IC device including a channel region; a gate region including a metal; and a gate dielectric between the channel region and the gate region, the gate dielectric including a perovskite material including oxygen, at least a portion of the perovskite material having a perovskite crystal structure.

Example 2 provides the IC device of example 1, where the perovskite material further includes strontium and titanium.

Example 3 provides the IC device of example 2, where the perovskite material further includes barium.

Example 4 provides the IC device of example 1, where the perovskite material further includes lanthanum and aluminum.

Example 5 provides the IC device of any of the preceding examples, where the channel region includes oxygen.

Example 6 provides the IC device of example 5, where the channel region further includes at least one of zinc and indium.

Example 7 provides the IC device of example 5 or 6, where the channel region further includes gallium.

Example 8 provides the IC device of any of the preceding examples, where the gate region includes at least one of ruthenium and iridium.

Example 9 provides the IC device of any of the preceding examples, where the gate region includes titanium and nitrogen.

Example 10 provides the IC device of any of the preceding examples, where the gate dielectric is over the gate region, and the channel region is over the gate dielectric.

Example 11 provides the IC device of example 10, further including a template layer between the gate dielectric and the gate region, the template layer including oxygen, strontium, and at least one additional metal.

Example 12 provides the IC device of example 11, where the additional metal is a first metal element, the template layer further including a second additional metal element.

Example 13 provides the IC device of example 11 or 12, where the template layer includes a perovskite oxide.

Example 14 provides the IC device of any of examples 11 through 13, where the additional metal includes one of titanium, ruthenium, iridium, scandium, rhodium, hafnium, barium, chromium, and iron.

Example 15 provides the IC device of any of examples 1 through 9, where the gate region is over the gate dielectric, and the gate dielectric is over the channel region.

Example 16 provides the IC device of any of examples 1 through 9, where the channel region is fin-shaped, and the gate dielectric is over the channel region.

Example 17 provides the IC device of any of examples 1 through 9, where the gate dielectric is formed around a portion of the channel region, and the gate region is formed around at least a portion of the gate dielectric.

Example 18 provides a transistor including a channel region; a gate region including ruthenium, iridium, or titanium; and a gate dielectric between the channel region and the gate region, the gate dielectric including strontium, titanium, and oxygen, or lanthanum, aluminum, and oxygen.

Example 19 provides the transistor of example 18, the gate dielectric including strontium, titanium, and oxygen, the gate dielectric further including barium.

Example 20 provides the transistor of example 18 or 19, where the gate dielectric is over the gate region, and the channel region is over the gate dielectric.

Example 21 provides an IC device including a channel region; a gate stack coupled to the channel region, the gate stack including a first dielectric region, at least a portion of the first dielectric region including a perovskite material having a perovskite crystal structure, and a first electrode; a second dielectric region coupled to the channel region, where the channel region is between the first dielectric region and the second dielectric region; and a second electrode coupled to the second dielectric region.

Example 22 provides the IC device of example 21, further including a first S/D contact coupled to the channel region and a second S/D contact coupled to the channel region.

Example 23 provides the IC device of example 22, where the first S/D contact, second S/D contact, first electrode, and second electrode are coupled to independent metal lines.

Example 24 provides the IC device of any of examples 21 through 23, where the channel region includes oxygen and at least one of indium and zinc.

Example 25 provides the IC device of example 24, where the channel region further includes gallium.

Example 26 provides the IC device of any of examples 21 through 25, where the perovskite material includes strontium, titanium, and oxygen.

Example 27 provides the IC device of example 26, where the perovskite material further includes barium.

Example 28 provides the IC device of any of examples 21 through 25, where the perovskite material includes lanthanum, aluminum, and oxygen.

Example 29 provides the IC device of any of examples 21 through 28, where the first electrode includes at least one of ruthenium and iridium.

Example 30 provides the IC device of any of examples 21 through 28, where the first electrode includes titanium and nitrogen.

Example 31 provides the IC device of any of examples 21 through 30, further including a template layer between the first electrode and the first dielectric region, the template layer including oxygen, strontium, and at least one additional metal.

Example 32 provides the IC device of example 31, where the template layer includes a perovskite oxide.

Example 33 provides the IC device of example 31 or 32, where the additional metal includes one of titanium, ruthenium, iridium, scandium, rhodium, hafnium, barium, chromium, and iron.

Example 34 provides the IC device of any of examples 21 through 33, where the second dielectric region includes hafnium and oxygen.

Example 35 provides the IC device of any of examples 21 through 34, where the second electrode includes ruthenium.

Example 36 provides the IC device of any of examples 21 through 34, where the second electrode includes titanium and nitrogen.

Example 37 provides a transistor including a channel region; a first dielectric coupled to the channel region, the first dielectric including a perovskite oxide; a second dielectric coupled to the channel region; a first electrode coupled to the first dielectric; and a second electrode coupled to the second dielectric; where a first voltage is applied to the first electrode, and a second voltage different from the first voltage is applied to the second electrode.

Example 38 provides the transistor of example 37, where the first electrode and the second electrode are on opposite sides of the channel region.

Example 39 provides the transistor of example 37 or 38, further including a first S/D contact coupled to the channel region and a second S/D contact coupled to the channel region.

Example 40 provides the transistor of example 39, where the second electrode is between the first S/D contact and the second S/D contact.

Example 41 provides the transistor of any of examples 37 through 40, where the second voltage sets a threshold voltage of the transistor.

Example 42 provides the transistor of example 41, where, at a first time, the second voltage is applied to the second electrode, and at a second time, a third voltage is applied to the second electrode, the third voltage different from the second voltage.

Example 43 provides the transistor of any of examples 37 through 42, where the first voltage has a first setting for turning the transistor on.

Example 44 provides the transistor of example 43, where the first voltage has a second setting for turning the transistor off.

Example 45 provides a method for operating a transistor, the method including sensing a threshold voltage of a transistor including a channel region, a gate electrode, a gate dielectric, and a body electrode; determining a first voltage to apply to the body electrode, where the first voltage alters the threshold voltage of the transistor; applying the first voltage to the body electrode; and applying a second voltage to the gate electrode, where the second voltage turns the transistor on.

Example 46 provides the method of example 45, further including applying a third voltage to the gate electrode, where the third voltage turns the transistor off.

Example 47 provides the method of example 45, the transistor further including a drain and a source, the method further including applying a third voltage to the drain and a fourth voltage to the source.

Example 48 provides the method of example 45, where the threshold voltage is sensed at a first time, the method further including sensing, at a second time, a second threshold voltage of the transistor; and determining a third voltage to apply to the body electrode, the third voltage different from the first voltage.

Example 49 provides the method of any of examples 45 through 48, where the transistor further includes a second dielectric coupled between the channel region and the body electrode.

Example 50 provides the method of example 45, where the gate dielectric includes strontium, titanium, and oxygen.

Example 51 provides the method of example 45, where the gate dielectric includes lanthanum, aluminum, and oxygen.

Example 52 provides an IC package that includes an IC die, including one or more of the IC devices according to any one of the preceding examples. The IC package may also include a further component, coupled to the IC die.

Example 53 provides the IC package according to example 52, where the further component is one of a package substrate, a flexible substrate, or an interposer.

Example 54 provides the IC package according to examples 52 or 53, where the further component is coupled to the IC die via one or more first level interconnects.

Example 55 provides the IC package according to example 54, where the one or more first level interconnects include one or more solder bumps, solder posts, or bond wires.

Example 56 provides a computing device that includes a circuit board; and an IC die coupled to the circuit board, where the IC die includes one or more of the transistor/IC devices according to any one of the preceding examples (e.g., transistor/IC devices according to any one of examples 1-44), and/or the IC die is included in the IC package according to any one of the preceding examples (e.g., the IC package according to any one of examples 52-55).

Example 57 provides the computing device according to example 56, where the computing device is a wearable computing device (e.g., a smart watch) or hand-held computing device (e.g., a mobile phone).

Example 58 provides the computing device according to examples 56 or 57, where the computing device is a server processor.

Example 59 provides the computing device according to examples 56 or 57, where the computing device is a motherboard.

Example 60 provides the computing device according to any one of examples 56-59, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device comprising:
a channel region;
a gate region comprising a metal;
a gate dielectric between the channel region and the gate region, the gate dielectric comprising a perovskite material comprising oxygen, at least a portion of the perovskite material having a perovskite crystal structure with a first lattice parameter; and
a template layer between the gate region and the gate dielectric, wherein the template layer has a perovskite crystal structure with a second lattice parameter, and the first lattice parameter is within 0.5 Angstroms of the second lattice parameter.

2. The IC device of claim 1, wherein the perovskite material further comprises strontium and titanium.

3. The IC device of claim 2, wherein the perovskite material further comprises barium.

4. The IC device of claim 1, wherein the perovskite material further comprises lanthanum and aluminum.

5. The IC device of claim 1, wherein the gate region comprises at least one of ruthenium and iridium.

6. The IC device of claim 1, wherein the gate region comprises titanium and nitrogen.

7. The IC device of claim 1, wherein the gate dielectric is over the gate region, and the channel region is over the gate dielectric; the template layer comprising oxygen, strontium, and at least one additional metal.

8. The IC device of claim 1, further comprising a substrate, wherein the gate region is over the substrate, and the template layer is over the gate region.

9. The IC device of claim 1, wherein the gate region, template layer, and gate dielectric are thin films.

10. The IC device of claim 1, wherein the template layer has a thickness of no more than 4 nanometers.

11. A transistor comprising:
a channel region;
a gate region comprising ruthenium, iridium, or titanium;
a template layer comprising a perovskite template material, the perovskite template material having a first lattice parameter; and
a gate dielectric between the channel region and the template layer, the gate dielectric comprising:
strontium, titanium, and oxygen; or
lanthanum, aluminum, and oxygen,
wherein at least a portion of the gate dielectric has a perovskite crystal structure with a second lattice parameter, and the first lattice parameter is within 0.5 Angstroms of the second lattice parameter.

12. The transistor of claim 11, the gate dielectric comprising strontium, titanium, and oxygen, the gate dielectric further comprising barium.

13. The transistor of claim 11, wherein the gate dielectric is over the gate region, and the channel region is over the gate dielectric.

14. The IC device of claim 8, further comprising a seed layer between the substrate and the gate region.

15. The IC device of claim 14, wherein the seed layer comprises tantalum.

16. An integrated circuit (IC) device comprising:
a substrate;
a gate electrode over the substrate;
a template layer over the gate electrode, wherein the template layer has a perovskite crystal structure with a first lattice parameter;
a gate dielectric over the template layer, wherein the gate dielectric has a perovskite crystal structure with a second lattice parameter, wherein the first lattice parameter is within 0.5 Angstroms of the second lattice parameter; and
a channel region over the gate dielectric.

17. The IC device of claim 16, wherein the template layer comprises oxygen, strontium, and at least one additional metal.

18. The IC device of claim 16, wherein the template layer has a thickness between 1.5 and 4 nanometers.

19. The IC device of claim 16, wherein a source contact and a drain contact are over the channel region.

20. The IC device of claim 16, further comprising a seed layer between the substrate and the gate electrode, the seed layer comprising tantalum.

* * * * *